United States Patent [19]

DiBugnara

[11] Patent Number: 4,979,076
[45] Date of Patent: Dec. 18, 1990

[54] HYBRID INTEGRATED CIRCUIT APPARATUS

[76] Inventor: Raymond DiBugnara, 18 Meadow Rd., Bolton, Mass. 01740

[21] Appl. No.: 375,033

[22] Filed: Jun. 30, 1989

[51] Int. Cl.$^5$ .............................................. H05K 1/18
[52] U.S. Cl. ..................................... 361/401; 361/386; 361/405; 361/406
[58] Field of Search ................................ 361/386–389, 361/400, 401, 402, 404–406

[56] References Cited

U.S. PATENT DOCUMENTS

| | | | |
|---|---|---|---|
| 3,142,783 | 7/1964 | Warren | 361/401 |
| 3,191,098 | 6/1965 | Fuller | 317/101 |
| 3,192,307 | 6/1965 | Lazar | 361/401 |
| 3,266,125 | 12/1967 | Tobolski | 29/832 |
| 3,290,756 | 12/1966 | Dreyer | 361/401 |
| 3,480,836 | 11/1969 | Aronstein | 361/401 |
| 3,517,272 | 6/1970 | Lee et al. | 361/401 |
| 4,030,001 | 6/1977 | Medley, Jr. et al. | 361/401 |
| 4,109,296 | 8/1978 | Rostek et al. | 361/401 |
| 4,393,438 | 7/1983 | Schelhorn | 361/401 |
| 4,511,796 | 4/1985 | Aigo | 235/92 |
| 4,653,822 | 3/1989 | Kanazawa | 339/17 |
| 4,661,653 | 4/1987 | Aigo | 174/52 |

Primary Examiner—Gregory D. Thompson
Attorney, Agent, or Firm—Wolf, Greenfield & Sacks

[57] ABSTRACT

A hybrid integrated circuit apparatus includes an electrical circuit component, having first and second leads connected thereto, disposed within an aperture extending from a first surface to a second surface of a circuit board, the circuit board having on each surface a circuit element bonded adjacent the aperture. A disk of fusible material, sized and positioned to fully extend over the aperture and partially over the circuit element, is melted and reformed in place, under vacuum conditions, so as to mechanically couple the electrical component within the board aperture, provide an electrical contact between the component lead and the circuit element, and hermetically seal the component within the circuit board.

10 Claims, 3 Drawing Sheets

HYBRID INTEGRATED CIRCUIT APPARATUS

FIELD OF THE INVENTION

This invention relates to the field of hybrid integrated circuits and, more specifically, to a circuit board apparatus in which the electrical components are integrated within the circuit board. In particular, the invention relates to a printed circuit board in which the electrical components are mechanically, electrically and hermetically coupled within the board circuit.

BACKGROUND OF THE INVENTION

The term "hermetic" as used herein means an airtight seal, as generally understood in industry and defined by the McGraw Hill Dictionary of Scientific and Technical Terms, 3rd Ed., 1984, McGraw Hill Book Company, New York, N.Y. The military definition of a hermetic seal is more specific and means, in particular, to a barrier through which water may not pass by means of conduction, diffusion, or osmosis. The apparatus and method of the present invention provides a hybrid integrated circuit apparatus in which electrical components are mechanically and electrically coupled, as well as hermetically sealed within a circuit board, by either the generally accepted or military definition of "hermetic" as explaned hereinafter.

Prior to the advent of semiconductor integrated circuits, variety of attempts were made to integrate miniaturized discrete electrical components within a circuit board itself. U.S. Pat. Nos. 3,142,783; 3,192,307; 3,266,125; and 3,290,756 all disclose methods or apparatus in which electrical components are disposed within a circuit board with the electrical interconnections made on the surface of the circuit board.

U.S. Pat. No. 3,142,783, Warren, discloses an electrical circuit system in which electrical components are recessed within apertures in a circuit board. An electrically conductive material, having overlying tabs adjacent each aperture, is bonded to the outer surfaces of the circuit board and serves to retain the electrical components within the apertures and provide electrical connections. Excessive conductive material is then removed to define the proper circuit paths among the components. The components are not hermetically sealed within the circuit board as required by many applications including military applications. Furthermore, a large number of steps are required to produce the apparatus.

U.S. Pat. No. 3,192,307, Lazar, discloses a connector for electrical components on printed circuit boards. In the Lazar patent, a connector element, formed of an insulating material, having an adhesive coating on its underside and a plurality of conductive members connected thereto, is positioned over an electric component disposed within an aperture in the printed circuit board. The conductive members on the connector element provide both mechanical and electrical coupling of the component to the printed circuit board. As with the Warren patent, the Lazar apparatus does not hermetically seal the component within the printed circuit board and furthermore the connector element can be impractical where a large number of components are integrated within a small area.

U.S. Pat. No. 3,266,125, Tobolski, discloses a method for making electrical circuit modules including the steps of soldering a plurality of electrical components between two conductive sheets to form a single unit. The resulting unit is placed in a mold to allow entry of a non-conductive material between the conductive sheets. Selective portions of conductive sheets are then removed to form the required circuit paths. As with the prior art, the components of the resulting board are not hermetically sealed within the circuit board. Furthermore, the method of forming the board and then defining the electrical circuit paths is highly complicated and cumbersome.

U.S. Pat. No. 3,290,756, Dreyer, discloses a method of assembling interconnecting electrical components. In Dreyer, a plurality of electrical components are disposed within holes in a circuit board. Insulating sheets, having a connecting patterns of conductive adhesive on their undersurfaces are placed in contact with both sides of the circuit board. The conductive adhesive is then cured to physically bond the sheets to the components and board and to electrically interconnect the components. Although the components of the resulting apparatus are hermetically sealed within the circuit board, the apparatus is impractical for replacement of a defective component due to the unitary sheets covering both surfaces of the apparatus.

None of the above methods or apparatus has gained wide spread acceptance probably due to either the complexity of the manufacturing process or shortcomings of the apparatus design.

Accordingly, it is an object of the present invention to provide a hybrid integrated circuit apparatus in which at least one electrical component is mechanically, electrically and hermetically coupled within the circuit board.

A further object of the present invention is to provide a hybrid integrated circuit apparatus in which a single means is used to mechanically, electrically, and hermetically couple the component within the printed circuit board.

Another object of the present invention is to provide a fast and economical method for manufacturing a hybrid integrated circuit apparatus having at least one electrical component mechanically, electrically and hermetically coupled within the circuit board.

Yet another object of the present invention is to provide a means for mechanically, electrically and hermetically coupling an electrical component within a circuit board which can compensate for the thermal expansion and contraction of the board without affecting the integrity of the hermetic seal or the electrical contact with the board.

BRIEF SUMMARY OF THE INVENTION

The foregoing and other objects of the present invention are achieved with a hybrid integrated circuit apparatus and method of manufacture in which an electrical circuit component, retained within an aperture in a printed circuit board, is mechanically coupled within the aperture, electrically coupled to a circuit path surrounding the aperture perimeter, and hermetically sealed within the board surface by a disk of conductive fusible material which has been melted and reformed in place.

The circuit board of the present invention is of the type having a first and second surface and defining at least one aperture extending from the first surface to the second surface. The circuit board has a predetermined length from the first surface to the second surface of the board. A first circuit element of electrically conductive material is bonded on the first surface of the circuit board and defines a first circuit portion surrounding the perimeter of the aperture. A second circuit element of electrically conductive material is bonded on the second surface of the circuit board and defines a second circuit portion surrounding the perimeter of the aperture.

An electrical component having first and second ends, spaced apart a distance substantially equal to the predetermined surface to surface length of the circuit board, and first and second leads connected thereto respectively, is disposed within the aperture of the circuit board so that the first and second leads of the electrical component are at the first and second surfaces of the printed circuit board, respectively.

A preformed disk of fusible material, preferably having a melting temperature below the melting temperature of the circuit elements bonded on the circuit board surfaces, is sized to fully extend over the aperture to completely cover the first end of the electrical component and at least partially cover the first circuit portion surrounding the aperture. Once in position, the disk is melted and reformed in place so that the under surface of the disk is in electrical contact with the first end of the electrical component and is further fused to and hermetically sealed at the first circuit portion adjacent the aperture.

An electrically conductive member, having similar dimensions to the preformed disk, is fused to the second surface of the circuit board so that the conductive member undersurface is in electrical contact with the second end of the electrical component and is further fused to and hermetically sealed at the second circuit portion adjacent the aperture in the circuit board.

The method of manufacturing the hybrid integrated circuit apparatus includes the steps of placing an electrical component having first and second ends and first and second leads connected thereto, respectively, into an aperture extending from a first surface to a second surface of a circuit board, the circuit board having, bonded to each surface, a circuit element surrounding the perimeter of the aperture and defining a circuit portion.

Next, a preformed disk of electrically conductive fusible material is positioned over the aperture in the circuit board so as to completely cover the aperture and at least partially cover the circuit portion adjacent the aperture at the first surface of the board.

A mold is applied to the disk and activated so that the disk is melted and reformed in place, the disk being thereby fused to and hermetically sealed at the first end of electrical component and the circuit portion on the first board surface.

At the same time, a conductive member, having similar dimensions to the preformed disk of fusible material, is positioned over the aperture in the circuit board so as to completely cover the aperture and at least partially cover the circuit portion adjacent the aperture at the second surface of the board.

A mold is applied to the conductive member so that the conductive member is fused to and hermetically sealed at the second end of the electrical component and the second circuit portion on the second board surface.

The invention will be more fully understood from the detailed description set forth below, which should be read in conjunction with the accompanying drawings. The invention is defined in the claims appended at the end of the detailed description, such description being exemplary only.

DETAILED DESCRIPTION OF AN ILLUSTRATIVE EMBODIMENT

Figure 4:
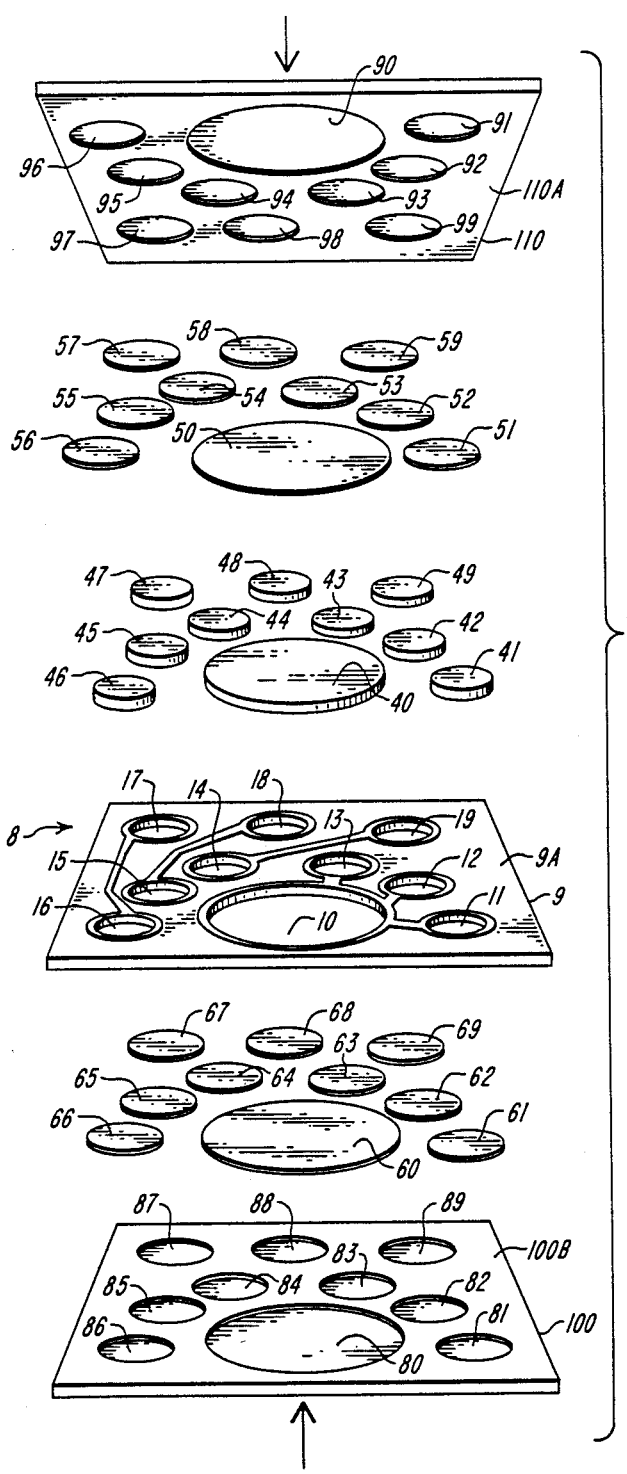
FIG. 4 is an exploded, front, perspective view of the apparatus components and supplementary equipment necessary for implementing the method of manufacture of the present invention.

Referring to the drawings, and in particular, FIG. 4, a hybrid integrated circuit apparatus is comprised of a printed circuit board 8, a plurality of electrical components 40-49 and a plurality of fusible disks 50-69.

Figure 1:
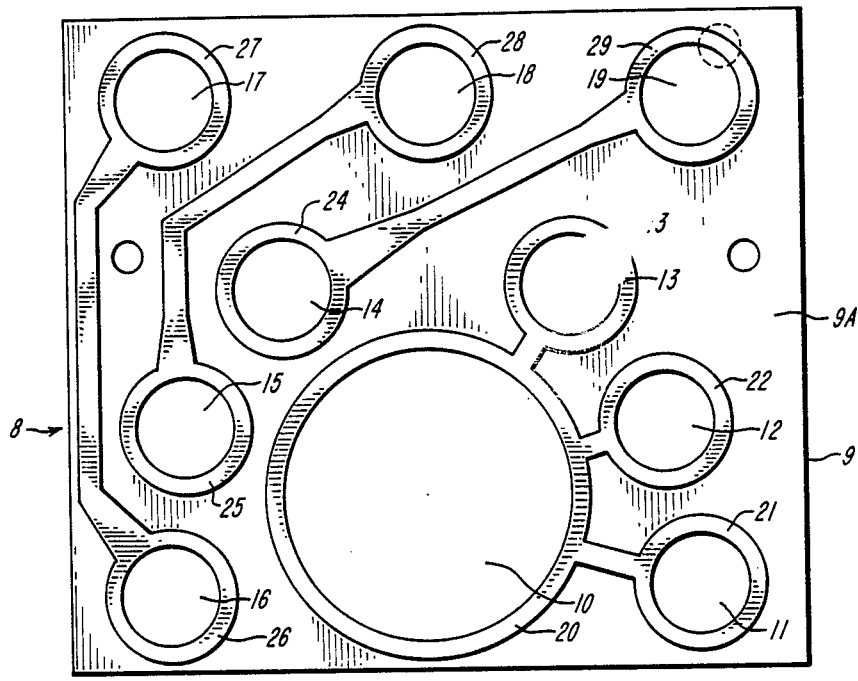
FIG. 1 is a top view of the printed circuit board of the present invention.
Figure 2:
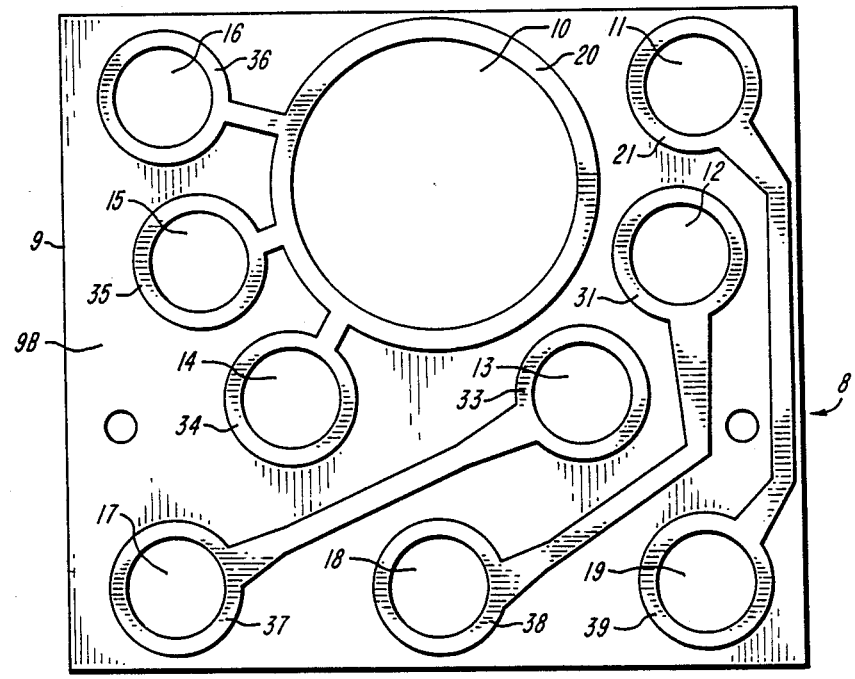
FIG. 2 is a bottom view of the printed circuit board of the present invention.

Referring to FIGS. 1 and 2, in particular, circuit board 8 is collectively comprised of board 9, having a plurality of apertures 10-19 extending therethrough, and circuit elements 20-39 bonded thereon.

Board 9 may be comprised of a non-conductive, insulating material such as fiberglass epoxy, including FR-4 and G-10. Other suitable materials include polyethylene, polypropylene, polyimide, Kapton, Teflon, ceramic or other conventional insulating printed circuit base. In the illustrative embodiment board 9 is square shaped with 0.6 inch sides and a thickness or height of approximately between 0.010 and 0.075 inches. However, the dimensions of the board may be left to the designer's discretion. A plurality of apertures 10-19 extend from a first surface 9A of the board, as shown in FIG. 1, to a second surface 9B of the board, shown in FIG. 2. The apertures are preferably formed by a conventional punch-through method. The profile of the apertures is preferably determined by the exterior profile of the electrical components to be retained within the apertures. In the illustrative embodiment, since cylindrically shaped components are used, circular shaped apertures are utilized. The apertures can be round, square, rectangular or of other regular or irregular shapes. The invention is not limited any particular component or aperture shape. The diameters of the apertures 10-19 correspond with the diameters of electrical components 40-49 which will be retained therein, respectively. In the preferred embodiment, the diameter of the apertures may range from 0.05 inches to 0.30 inches but, are not limited thereto.

The first surface 9A of board 9 has a plurality of circuit elements 20-29 bonded thereon. Similarly, the second surface 9B of board 9 has a similar number of circuit elements 30-39 bonded thereon. Circuit elements 20-39, in the preferred embodiment, are comprised of a copper cladding approximately 0.004 inch thick which has been bonded and solder-clad to board 9. However, circuit elements 20-39 may be made of any electrically conductive material and bonded to board 9 by any conventional method.

As shown in FIG. 1, circuit elements 20-29 are adjacent apertures 10-19. In the preferred embodiment, the circuit elements 20–29 define an approximately 0.3 inch circuit portion around the perimeter of apertures 10–19, respectively. Each circuit element 20–29 is electrically connected to at least one other circuit element on surface 9A. The circuit element and circuit portion collectively function as a node in an electrical circuit. The pattern and number of circuit elements and circuit portions is left to the designer's discretion, depending on the number of nodes in the desired circuit configuration.

A similar plurality of circuit elements 30–39, of similar dimension and composition as circuit elements 20–29, are plated onto surface 9B of board 9, as shown in FIG. 2. Circuit elements 30–39 are positioned adjacent apertures 10–19 respectively, with each circuit element defining approximately 0.3 inch circuit portion around the perimeter of its respective aperture. Each circuit element 30–39 is joined to at least one other circuit element on second surface 9B.

In the illustrative embodiment, although the interconnecting circuit elements or paths on first surface 9A and second surface 9B of board 9 are identical, it is obvious to one reasonably skilled in the art that such is not a requirement of the present invention and, with circuits of increased complexity, will not be the case.

Figure 3:
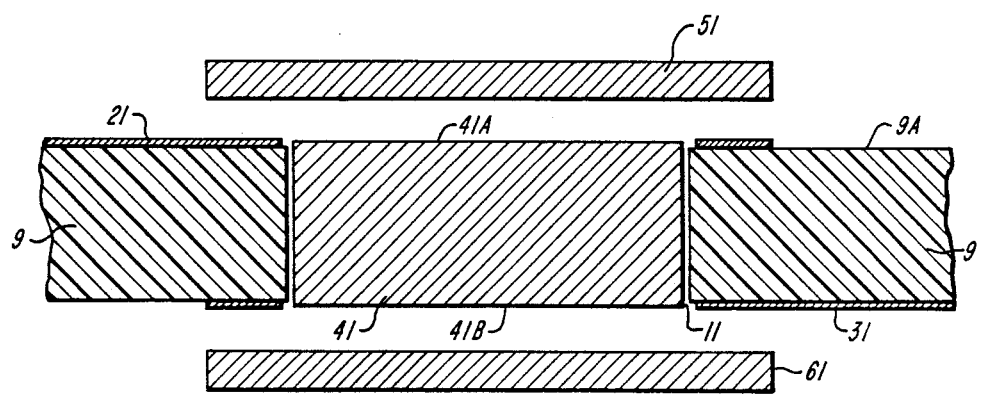
FIG. 3 is an exploded, cut-away, side view of the present invention illustrating the relationships of the apparatus components to one another.

A plurality of electrical components 40–49, as shown in FIGS. 3 and 4, are retained within apertures 10–19 in circuit board 9. Components 40–49 and circuit elements 20–39 collectively form an electrical circuit, the specific design of which may vary according to the designer's preference. In the preferred embodiment, components 40–49 have cylindrical shapes, however, the component shapes should not be limited thereto and can vary greatly.

Such cylindrical or pellet-type components are commercially available, with good electrical properties, in varying diameters and preferably uniform thicknesses. If the components are not available in uniform thickness, electrically conductive spacers may be utilized. The electrical components utilized in the present invention have diameters which correspond closely to the diameter of the respective aperture in circuit board 9. For example, component 41 and aperture 11, as shown in FIG. 3, both have an approximate diameter of 0.085 inches, with aperture 11 being approximately 0.005 inches larger than component 41. When component 41 is inserted into aperture 11 it will be temporarily retained by frictional or gravitational forces without the need for temporary retention means such as adhesives, etc. Component 41 has a first lead 41A and a second lead 41B which, in the preferred embodiment, are substantially planar but may have other forms. First lead 41A is attached to the first end of component 41 while a second lead 41B is attached to the second end of component 41.

In the preferred embodiment, first lead 41A and second lead 41B are comprised of a solderable silver approximately 0.002 inches thick. The total thickness of electrical component 41 including the leads is approximately equal to the thickness of board 9. When component 41 is disposed within aperture 11 first lead 41A is flush with surface 9A and circuit element 21. Similarly, the second lead 41B should be flush with surface 9B and circuit element 31.

In the circuit of the illustrative embodiment, electrical components 40–49 are primarily diodes, however, any component such as resistors or capacitors which can be embodied in a two or more leaded package may be utilized with the present invention.

As shown in FIG. 4, a plurality of disks 50–59 comprised of an electrically conductive, fusible material are positioned over apertures 10–19 respectively. The term fusible refers to any material which adhere to other materials by applying heat and pressure with or without the use of an adhesive agent. In the preferred embodiment, any one of a number of a solder compositions having melting temperatures below that of circuit elements 20–39 and the planar leads of components 40–49 will suffice. Circuit elements 20–39 and the planar leads of electrical components 40–49 are preferably comprised of a 63/37 solder cladding having a melting temperature of 183° C. The following is a table of preferred solder compositions which the fusible disks 50–59 may be comprised of and which are compatible with the melting points of the electrical components and the board substrate. The solder compositions of Sn Pb 63/67 and Sn Ag 96.5/3.5 are the most preferred for commercial and military applications, respectively.

| PREFERRED SOLDERS | | | | | | |
|---|---|---|---|---|---|---|
| COMPOSITION, % | | | | TEMPERATURE | | Working Temp Freezing Range |
| Tin | Lead | Antimony | Silver | Solidus | Liquidus | |
| 96.5 | 0 | 0 | 3.5 | 221° C. | 221° C. | 0° C. |
| 80 | 20 | 0 | 0 | 183 | 203 | 20 |
| 70 | 30 | 0 | 0 | 183 | 192 | 9 |
| 63 | 37 | 0 | 0 | 183 | 183 | 0 |
| 60 | 40 | 0 | 0 | 183 | 189 | 6 |
| 50 | 50 | 0 | 0 | 183 | 216 | 33 |
| 49 | 50 | 1 | 0 | 186 | 210 | 24 |
| 40 | 60 | 0 | 0 | 183 | 234 | 51 |
| 39 | 60 | 1 | 0 | 186 | 230 | 44 |
| 30 | 70 | 0 | 0 | 183 | 252 | 69 |
| 29 | 70 | 1 | 0 | 186 | 252 | 66 |
| 20 | 80 | 0 | 0 | 183 | 273 | 90 |
| 20 | 78.75 | 0 | 1.25 | 180 | 270 | 90 |
| 19 | 80 | 1 | 0 | 185 | 273 | 88 |
| 10 | 88.50 | 0 | 1.50 | 178 | 290 | 112 |
| 10 | 90 | 0 | 0 | 183 | 297 | 114 |
| 5 | 95 | 0 | 0 | 270 | 311 | 41 |
| 2.5 | 97.5 | 0 | 0 | 301 | 319 | 18 |

Fusible disks 50–59 are sized to fully extend over their respective apertures and circuit elements. As shown in FIG. 3, disk 51 when positioned on first surface 9A is sized to fully extend over aperture 11 and at least partially cover circuit element 21 adjacent aperture 11. Accordingly, the diameter of a fusible disk is approximately equal to the diameter of the aperture over which it will be positioned plus preferably approximately 0.050 inches. Larger diameter disks can be used if desired.

In the preferred embodiments, the fusible disks preferably have a thickness of between 10–50 mils. Disks 50–59 are typically manufactured by conventional punch-through method from a sheet of solder. To facilitate disk manufacturing the ratio of disk diameter to disk thickness preferably should be greater than 2:1.

Once in position over their respective apertures, under vacuum conditions, each of disks 50–59 are at least partially melted and reformed in place so as to mechanically, electrically and hermetically couple their respective electrical components within their respective apertures in the circuit board. For example, once melted and reformed in place, the bottom surface of disk 51, as shown in FIG. 3, is fused to both first lead 41A of electrical component 41 and circuit element 21 thereby forming a continuous conductive path between the three surfaces. Preferably, disk 51 is fused to circuit element 21 around the complete perimeter of aperture 11 thereby mechanically coupling component 41 within aperture 11 and hermetically sealing component 41 beneath first surface 9A of board 9.

A second set of disks 60-69, having identical composition, dimensions and function as disks 50-59 are positioned on surface 9B of board 9, and, under similar vacuum conditions, melted and reformed in place over their respective apertures. As shown in FIG. 3, disk 61 is positioned under aperture 11 at surface 9B. Once melted and reformed in place, the upper surface of disk 61 is fused to both second lead 41B of electrical component 41 and circuit element 31 thereby forming a continuous conductive path between the three surfaces. Preferably, disk 61 is fused to circuit element 31 around the complete perimeter of aperture 11 thereby mechanically coupling component 41 within aperture 11 and hermetically sealing component 41 beneath second surface 9B and within the interior of circuit board 9.

The hermetic seal, formed by disks 51 and 61 fused to first surface 9A and second surface 9B respectively, provides a vacuum-sealed air tight chamber for electrical component 41 through which moisture may not permeate. For military applications, in in addition to the hermetic seal formed by disks 51 and 61, board 9 should be comprised of glass or ceramic to further enhance the hermetic seal around component 41.

In an alternate embodiment, second disks 60-69 may be formed of solder clad copper and similarly fused to their respective electrical component and circuit elements. One or more of disks 50-69 may be replaced by such a solder clad copper disk which may additionally have a projectile lead extending therefrom for connection to other electrical apparatus.

Disks made wholly of fusible material such as solder, are preferably used to secure the electrical components within the circuit board since such disks have improved thermal stability and ability to maintain a hermetic seal despite thermal expansion and contraction of the circuit board. If a conventional metallic disk, such as a copper disk, with a solder undercoating is used, its ability to adapt to thermal expansion or contraction of the circuit board could possible cause breaks in the solder seal thereby leading to possible loss of the electrical connection as well as breaking of the hermetic seal. In all cases it is preferred to match the thermal expansion characteristics of the disk or conductive member with the thermal expansion characteristic of the board and its conductive element sealed to the disk. Most preferably, the circuit elements 20-39 and disks 50-69 each have a thermal coefficient of expansion in the range of $-55°$ to $+150°$ C. which is not greater than 25 microinches per inch/$°$ C. different from each other or circuit board 9 over the range.

In the preferred embodiment, fusible disks 50-59 and disks 60-69 are identical in composition and dimension. However, as indicated in the second embodiment of the invention disks 60-69 may be different in composition and structure. In the second embodiment both disks 50-59 and disks 60-69 should have a fusible, electrically conducting contacting surface adjacent the printed circuit board and circuit elements. The remaining portion of disks 50-69 are preferably electrically conductive but may be made of a non-conductive material which provides adequate thermal conduction as well as mechanical support. Such disk constructions which are adequate to implement disks 60-69 include disks made wholly of solder, copper or copper alloy disks with solder cladding, porcelain disks with solder cladding, and various other non-conducting materials with solder cladding on at least the contacting surface.

The preferred method of manufacturing the hybrid integrated circuit apparatus of the present invention is described as follows. As shown in FIG. 4, a mold 100 has a fusing surface 100B containing a plurality of shallow cavities 80-89 arranged in a pattern which corresponds to the positions of apertures 10-19 in circuit board 9. Disks 60-69 are placed in their respective cavities in mold 100. Next, circuit board 9 is positioned adjacent mold 100 so that second surface 9B is adjacent fusing surface 100B and apertures 10-19 are aligned with fusible disks 60-69. Next, electrical components 40-49 are inserted into apertures 10-19. A second mold 110 has a fusing surface 110A in which a plurality of shallow cavities 90-99 are arranged to correspond to the positions of apertures 10-19 in circuit board 9. Fusible disks 50-59 are positioned into cavities 90-99 and retained there temporarily by conventional suction means within mold 110. Mold 110, containing disks 50-59 recessed within cavities 90-99, is then lowered onto circuit board 9 so that disks 50-59 are aligned over apertures 10-19 and circuit elements 20-21 on first surface 9A of circuit board 9. In a conventional vacuum environment, opposing coaxial forces are applied to molds 100 and 110 while both molds are simultaneously heated by conventional means. The pressure and heat applied by the cavities on fusible disks melts and reforms the disks in place thereby fusing the disks to their corresponding electrical components and adjacent circuit elements and forming a hermetic seal. Molds 110 and 100 are then allowed to cool and are removed.

Figure 5:
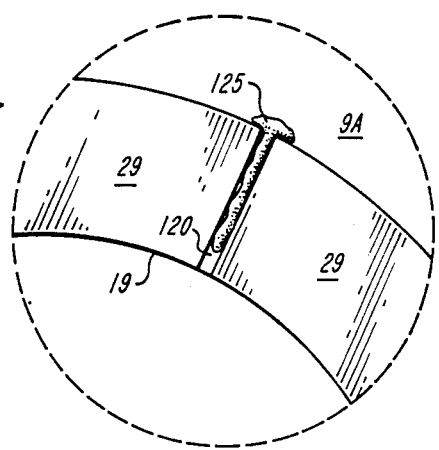
FIG. 5 is a partial enlarged view of FIG. 1 illustrating the exhaust vent and sealant of the hybrid integrated circuit of the present invention.

In the preferred method of the present invention disks 50-69 are melted and reformed in a vacuum environment thereby providing a vacuum-sealed, hermetic seal which is suitable for industrial as well as military applications. Alternately, if a vacuum environment is not used, a means must be provided for venting expanding gases from apertures 10-19 which expansion is caused by the heating and melting of disks 50-69. In particular, a microscopic exhaust vent 120 (FIG. 5), approximately 0.01 inches wide, may be provided on surfaces 9A and 9B at each of apertures 10-19. The exhaust vents may be implemented as either a break in circuit elements 20-39, which contains no electrically conductive material, or as a groove indentation in surfaces 9A and 9B which extend from the perimeter of apertures 10-19 to slightly beyond the adjacent circuit elements. In this manner, an escape path is provided for gases from the interior of apertures 10-19 as disks 50-69 are melted. The exhaust vents are then closed with a sealant 125 (FIG. 5) to provide an airtight, hermetic seal around the components, the seal being adequate for most industrial applications. A sealant adequate for use in the present invention may be any number of epoxy resins, acrylates, or silicone sealants, including silicone rubber. The complete printed circuit board may be optionally coated with such a sealant, in addition to the individual exhaust vents openings.

Cavities 80-99 are required to prevent disks 50-69 from flowing into a spherical shape when heated and maintains the fusible material in substantially a final desired shape pressed into electrical contact with the component and circuit element. In this method, no flux agent of any kind may be required to promote fusing of the disks to the circuit board surfaces.

A detailed example of manufacturing one portion of the hybrid integrated circuit apparatus will facilitate an understanding of the method of manufacturing the present invention. First, disk 61 is placed within cavity 81 in fusing surface 100B of mold 100. Next, circuit board 9 is placed on top of mold 100 so that second surface 9B is adjacent fusing surface 100B of mold 100. Component 41 is then inserted into aperture 11 of circuit board 9. Next, disk 51 is inserted into cavity 91 of mold 110 and maintained there by conventional suction means. Mold 110 is positioned on top of board 9 so that fusing surface 110A of mold 110 is adjacent first surface 9A of board 9. In this position, disk 61 is aligned over second end 41B and circuit element 31 on surface 9B of circuit board 9. Likewise, disk 51 is aligned over first lead 41A and circuit element 41 at surface 9A of circuit board 9. In a vacuum environment, opposing coaxial forces are applied to mold 100 and 110, thereby pressing hybrid integrated circuit apparatus 6 between molds 110 and 100. Simultaneously, molds 110 and 100 are heated causing disks 61 and 51 to melt. As the molds cool, disks 61 and 51 reform to the shape of cavities 81 and 91, respectively, while remaining stationary. The molds are then removed when sufficiently cool and printed circuit apparatus 6 is removed from the mold.

As a result, fusible disk 51 is fused to first lead 41A of electrical component 41 and circuit element 21 at first surface 9A. Similarly, disk 61 is fused to second lead 41B of component 41 and circuit element 31 at surface 9B of circuit board 9. By this process, fusible disks 51 and 61 are used to create electrical connections between electrical component 41 and the appropriate circuit elements on the first and second surfaces of the board. Disks 51 and 61 further mechanically couple electrical component 41 within the board interior. Furthermore, because of the complete fusing of disks 51 and 61 to circuit elements 21 and 31 respectively, in a vacuum environment component 41 is hermetically sealed within aperture 11.

As illustrated by the above examples, the apparatus and methods of the present invention use a fusible means to electrically, mechanically and hermetically couple components within an integrated circuit board. Furthermore, the fusible means is able to adapt to the thermal expansion and contraction of the circuit board thereby maintaining the integrity of the electrical contact, the hermetic seal and mechanical coupling of the component within the circuit board. Additionally, the method of manufacture of the present invention is efficient, economical and highly reliable.

Once the hybrid integrated circuit apparatus 6 is completely manufactured, it may optionally be protected in a resin filled container, with only the projectile leads of the circuit extending therefrom, or be transfer molded. Such a resin coating may also serve to close any existing exhaust vents if present.

While the method of this invention has been described with respect to a component to be sealed in a board having leads on either side, in some cases the disks and methods of this invention can be used to seal and electrically contact only one surface of a printed circuit board. For example, one side of a component may be sealed and contacted on one side of a printed circuit board by a disk and method of this invention and the other side of the component may be contacted by other means. Thus the disk on one side of the board can be a fusible disk as herein described while the conductive member may be of some other construction and/or can be attached by any method of attachment.

Having thus described one particular embodiment, various alterations, modifications and improvements will readily occur to those skilled in the art. Such alterations, modifications and improvements as are made obvious by this disclosure are intended to be part of this description though not expressly stated herein and are intended to be within the spirit and scope of the invention. Accordingly, the foregoing description is intended to be exemplary only, and not limiting. The invention is limited only as defined in the following claims and equivalence thereto.

What is claimed:

1. A hybrid integrated circuit apparatus comprising:
    a circuit board having a first surface and a second surface and defining at least one aperture extending from said first surface to said second surface of said board,
    said circuit board having a first circuit element bonded on said first surface,
    said first circuit element defining a first circuit portion adjacent said aperture,
    said circuit board having a second circuit element bonded on said second surface,
    said second circuit element defining a second circuit portion adjacent said aperture,
    said circuit board having a predetermined length from said first surface to said second surface;
    an electrical component having a first lead at a first end thereof and a second lead at a second end thereof, said first lead and said second lead being spaced apart a distance approximately equal to said predetermined length, said electrical component disposed in said aperture so that said first lead of said component is about at said first surface of said circuit board and said second lead of said component is about at said second surface of said circuit board;
    a first preformed disk comprising fusible material having a melting temperature below the melting temperature of said first circuit element and being sized to fully extend over said aperture to cover said first end of said electrical component and contact said first circuit portion, said first disk having been melted and reformed in place with said first disk having a surface in electrical contact with said first end of said electrical component in said circuit board and being fused to said first circuit portion thereby forming a hermetic seal; and
    an electrically conductive member fused to said second end of said electrical component in said circuit board and further fused to said second circuit element thereby forming a hermetic seal enclosing said second end of said electrical component in said circuit board.

2. The hybrid integrated circuit apparatus of claim 1 in which said electrically conductive member comprises a disk of fusible material melted and reformed in place.

3. The hybrid integrated circuit apparatus of claim 1 in which said first lead and said second lead of said electrical component have surfaces which mate with the contacting surfaces of said first disk and said electrically conductive member, respectively.

4. The hybrid integrated circuit apparatus of claim 1 in which said first lead and said second lead of said electrical component are planar.

5. The hybrid integrated circuit apparatus of claim 4 in which said first and said second leads of said electrical component are substantially coplanar with said first and said second surfaces of said circuit board respectively.

6. The hybrid integrated circuit apparatus of claim 1 in which the thermal coefficient of expansion of said first preformed disk is within 25 microinches per inch/° C. of thermal coefficient of expansion of said circuit board and said first circuit element over the range from −55° C. to 150° C.

7. The hybrid integrated circuit apparatus of claim 1 in which the thermal coefficient of expansion of said electrically conductive member is within 25 microinches per inch/° C. of the thermal coefficient of expansion of said circuit board and said second circuit element over the range from −55° C. to 150° C.

8. The hybrid integrated circuit apparatus of claim 1 further comprising a means for venting fluids from the interior of said aperture.

9. The hybrid integrated circuit apparatus of claim 8 further comprising a means for sealing said fluid venting means thereby forming an airtight chamber around said electrical component.

10. A hybrid integrated circuit apparatus comprising:
a circuit board defining at least one aperture extending from a first surface to a second surface of said circuit board,
said circuit board having a first circuit element bonded on said first surface,
said first circuit element defining a first circuit portion surrounding said aperture,
said circuit board having a second circuit element bonded on said second surface,
said second circuit element defining a second circuit portion adjacent said aperture,
said circuit board having a predetermined length from said first surface to said second surface of between 0.010 inches and 0.075 inches,
said aperture being circular in shape and having a diameter of between 0.05 inches and 0.30 inches;
an electrical component having a first planar lead at a first end thereof and a second planar lead at a second end thereof, said first planar lead and said second planar lead being spaced apart a distance equal to said predetermined length, said electrical component disposed in said aperture so that said first planar lead of said component is coplanar with said first surface of said circuit board and said second planar lead of said component is coplanar with said second surface of said circuit board;
a first preformed disk comprising fusible material having a melting temperature below the melting temperature of said first circuit element and being sized to fully extend over said aperture to cover said first end of said electrical component and contact said first circuit portion, said first disk having a thickness of between 10 mils and 50 mils, said first disk having been melted and reformed in place with said first disk having a surface in electrical contact with said first end of said electrical component in said circuit board and being fused to said first circuit portion thereby forming a hermetic seal, said preformed disk having a thermal co-efficient of expansion of within 25 microinches per inch/° C. of the thermal co-efficients of expansion of said circuit board and said first circuit element over the range from −55° C. to 150° C.; and
an electrically conductive member fused to said second end of said electrical component in said circuit board and further fused to said second circuit element thereby forming a hermetic seal and enclosing said second end of said electrical component in said circuit board, said electrically conductive member having a thermal co-efficient of expansion of within 25 microinches per inch/° C. of the thermal co-efficients of expansion of said circuit board and said second circuit element over the range from −55° C. to 150° C.

* * * * *